US012183610B2

(12) United States Patent
Matsutori

(10) Patent No.: US 12,183,610 B2
(45) Date of Patent: Dec. 31, 2024

(54) SUBSTRATE STORAGE CONTAINER

(71) Applicant: Miraial Co. Ltd., Tokyo (JP)

(72) Inventor: Chiaki Matsutori, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 55 days.

(21) Appl. No.: 18/004,480

(22) PCT Filed: Jul. 10, 2020

(86) PCT No.: PCT/JP2020/027104
§ 371 (c)(1),
(2) Date: Jan. 6, 2023

(87) PCT Pub. No.: WO2022/009430
PCT Pub. Date: Jan. 13, 2022

(65) Prior Publication Data

US 2023/0260813 A1 Aug. 17, 2023

(51) Int. Cl.
*H01L 21/673* (2006.01)

(52) U.S. Cl.
CPC .. *H01L 21/67386* (2013.01); *H01L 21/67389* (2013.01)

(58) Field of Classification Search
CPC ............. H01L 21/673; H01L 21/67379; H01L 21/67386; H01L 21/67389
USPC ............................... 206/710, 711; 211/41.18
See application file for complete search history.

(56) References Cited

U.S. PATENT DOCUMENTS 6,006,919 A * 12/1999 Betsuyaku ........ H01L 21/67294 206/711
6,398,033 B1 * 6/2002 Wu .................. H01L 21/67379 206/711
6,902,063 B2 * 6/2005 Pai .................... H01L 21/67373 206/711
7,422,107 B2 * 9/2008 Burns ............... H01L 21/67379 206/710
8,881,907 B2 * 11/2014 Yamagishi ........ H01L 21/67379 206/711
10,535,540 B2 * 1/2020 Kanamori ......... H01L 21/67366
11,025,099 B2 * 6/2021 Mese .................... H02J 50/001
2002/0130061 A1 * 9/2002 Hengst .............. H01L 21/67303 206/711

(Continued)

FOREIGN PATENT DOCUMENTS

JP H11079274 A1 3/1999
JP 2005064275 A 3/2005

(Continued)

*Primary Examiner* — Bryon P Gehman
(74) *Attorney, Agent, or Firm* — MUNCY, GEISSLER, OLDS & LOWE, P.C.

(57) ABSTRACT

A substrate storing container includes: a container main body; a lid body which is attachable to and detachable from a container main body opening portion, and which is able to block the container main body opening portion; and a component which is attached to the container main body or to the lid body. A connected part between the component and the container main body, the lid body or another component includes press-fit fixing portions, which are positioned by means of press fitting while being fixed to each other; and impulse welding portions which are formed by impulse welding, to maintain the positioning and fixing in the press-fit fixing portions.

5 Claims, 12 Drawing Sheets

(56) References Cited

U.S. PATENT DOCUMENTS

| | | | | |
|---|---|---|---|---|
| 2015/0318196 | A1* | 11/2015 | Fukuda | H01L 21/67386 206/454 |
| 2017/0287758 | A1 | 10/2017 | Kanamori et al. | |
| 2018/0174874 | A1* | 6/2018 | Bandreddi | H01L 21/67389 |
| 2020/0075374 | A1* | 3/2020 | Smith | H01L 21/67017 |
| 2022/0277977 | A1* | 9/2022 | Kanai | H01L 21/67369 |

FOREIGN PATENT DOCUMENTS

| | | | |
|---|---|---|---|
| JP | 2005153963 | A | 6/2005 |
| JP | 2005530331 | A | 10/2005 |
| JP | 2017017264 | A | 1/2017 |
| JP | 2018113298 | A | 7/2018 |
| WO | WO03/041937 | A1 | 5/2003 |
| WO | WO2016/047163 | A1 | 3/2016 |

* cited by examiner 1
2
3
4
5
20
21
22
23
24
25
26
27
28
91
231A
231B
235
236
241A
241B
243
244
281
W
302
303
303A
303B
32A
32B
33
D1
D2
D3
D11
D12
D21
D22
D31
D32
UP

2
D12
D1
D2
D21
D22
D11
20
22
81
83
23
8
236
60
6
512
24
511
25
51
28
21
5

83
82
81
812
814
801,8011
812
811
213

SUBSTRATE STORAGE CONTAINER

TECHNICAL FIELD

The present invention relates to a substrate storing container used when storing, keeping, transferring, and transporting a substrate made up of a semiconductor wafer or the like.

BACKGROUND ART

Conventionally, as for substrate storing containers for storing and transferring substrates made up of semiconductor wafers, containers having a configuration that includes a container main body and a lid body have been known (see Patent Documents 1 and 2).

The container main body has a tubular wall portion in which a container main body opening portion is formed at one end, and in which the other end is blocked. A substrate storing space is formed in the container main body. The substrate storing space is formed by being surrounded by the wall portion and can store a plurality of substrates. The lid body is attachable to and detachable from the container main body opening portion and is capable of blocking the container main body opening portion.

A front retainer is provided at a part of the lid body that faces the substrate storing space when the container main body opening portion is blocked. The front retainer is capable of supporting edge portions of a plurality of substrates when the container main body opening portion is blocked by the lid body. A back side substrate support portion is provided in the wall portion so as to make a pair with the front retainer. The back side substrate support portion is capable of supporting edge portions of the plurality of substrates. When the container main body opening portion is blocked by the lid body, the back side substrate support portion supports the plurality of substrates in cooperation with the front retainer. As a result, the back side substrate support portion retains the plurality of substrates in a state where adjacent substrates are separated from each other at a predetermined interval and arranged in parallel.

Patent Document 1: Japanese Unexamined Patent Application (Translation of PCT Application), Publication No. 2005-530331 Patent Document 2: Japanese Unexamined Patent Application, Publication No. 2018-113298

DISCLOSURE OF THE INVENTION

Problems to be Solved by the Invention

In a substrate storing container, a plurality of thermoplastic resin components are often fixed to the container main body or the like for use, and as a fixing method, a snap method, fitting (press fitting), fastening such as threaded fastening or the like has been performed. However, due to vibration, external force, sudden temperature change (expansion/contraction) by cleaning, and the like on the substrate storing container, "loosening/disengagement" in the fixing may occur.

For this, there is a method of welding and fixing by taking advantage of characteristics of thermoplastic resin. As the method, ultrasonic welding can be used. That is, joining is performed by applying ultrasonic vibration and pressure to a joined portion of a thermoplastic resin component with respect to the container main body.

However, the largest problem with the ultrasonic welding is that particles are generated from a site joined by welding. Specifically, fine resin powder is generated in a stage before melting due to friction by vibration of ultrasonic waves. The resin powder is adhered to the surface of or around a melting portion. In this state, the resin powder easily falls off and generates particles. Further, after melting, the surface roughens around the melting portion, and a part of this rough surface falls off and generates particles. The generation of particles in this way will cause a fatal problem in producing semiconductor chips, which will continue to be miniaturized in future.

Even when ultrasonic welding is performed on an outside of the substrate storing container, there is a remarkably high possibility that particles will wrap around an inside of the substrate storing container when the substrate storing container is cleaned and dried, which also leads to contamination of a cleaning device. For this reason, regardless of whether the ultrasonic welding is performed on the inside or outside of the substrate storing container, there is concern of an adverse effect due to particles.

Further, although it is necessary to apply ultrasonic vibration to perform ultrasonic welding, the ultrasonic vibration does not occur in a state where components to be welded to each other are positioned, for example, by press fitting. For this reason, it is necessary to loosely position in advance the components to be welded to each other. As a result, positioning accuracy decreases. Further, when ultrasonic vibration is applied, a load is applied to the components to be welded to each other, and hence the components may be deformed.

It is an object of the present invention is to provide a substrate storing container manufactured without performing any ultrasonic welding, in which generation of particles is suppressed, and decrease in component positioning accuracy is suppressed.

Means for Solving the Problems

The present invention relates to a substrate storing container that includes: a container main body that includes: a tubular wall portion including an opening circumferential portion provided with a container main body opening portion formed in one end portion, with another end portion being blocked; and a substrate storing space that is made by an inner face of the wall portion, can store a plurality of substrates and communicates with the container main body opening portion; a lid body that is attachable to and detachable from the container main body opening portion, and can block the container main body opening portion; and a component that is attached to the container main body or the lid body. A connected part between the component and the container main body, the lid body or another component includes press-fit fixing portions that are configured by being positioned by means of press fitting while being fixed to each other; and an impulse welding portion that is formed by impulse welding, to maintain the positioning and fixing in the press-fit fixing portions.

It is preferable that each of the press-fit fixing portions is made up of a convex member, and an inserted portion into which the convex member is inserted, the convex member has a base portion that is press fitted, positioned and fixed into a tip side portion of the inserted portion, the base portion of the convex member and the tip side portion of the inserted portion constitute the press-fit fixing portion, and the tip side portion of the convex member is impulse welded to the base portion of the inserted portion, and the tip side portion of the convex member and the base portion of the inserted portion constitute the impulse welding portion.

It is also preferable that each of the press-fit fixing portions is made up of a convex member, and an inserted portion into which the convex member is inserted, the convex member is press fitted, positioned and fixed into the inserted portion, the convex member and the inserted portion constitute the press-fit fixing portion, a tip side portion of the convex member does not constitute the impulse welding portion, and another part different from the convex member constitutes the impulse welding portion.

It is further preferable that the container main body includes the wall portion including a back wall, an upper wall, a lower wall, and a pair of side walls, the other end portion of the wall portion is blocked by the back wall, and the container main body opening portion is formed by one end portion of the upper wall, one end portion of the lower wall, and one end portion of each of the side walls, and the component is a bottom plate that is fixed to the lower wall to constitute a bottom portion of the container main body together with the lower wall.

It is preferable to further include a ventilation path allowing communication between the substrate storing space and a space outside the container main body, and a gas ejection nozzle portion including a plurality of opening portions that supply, to the substrate storing space, gas flowing into the ventilation path, the gas ejection nozzle portion is made up of a plurality of components connected to each other, and a connected part between the plurality of components includes the press-fit fixing portions and the impulse welding portion.

Effects of the Invention

The present invention makes it possible to provide a substrate storing container manufactured without performing any ultrasonic welding, in which generation of particles is suppressed, and decrease in component positioning accuracy is suppressed.

PREFERRED MODE FOR CARRYING OUT THE INVENTION

Figure 1:
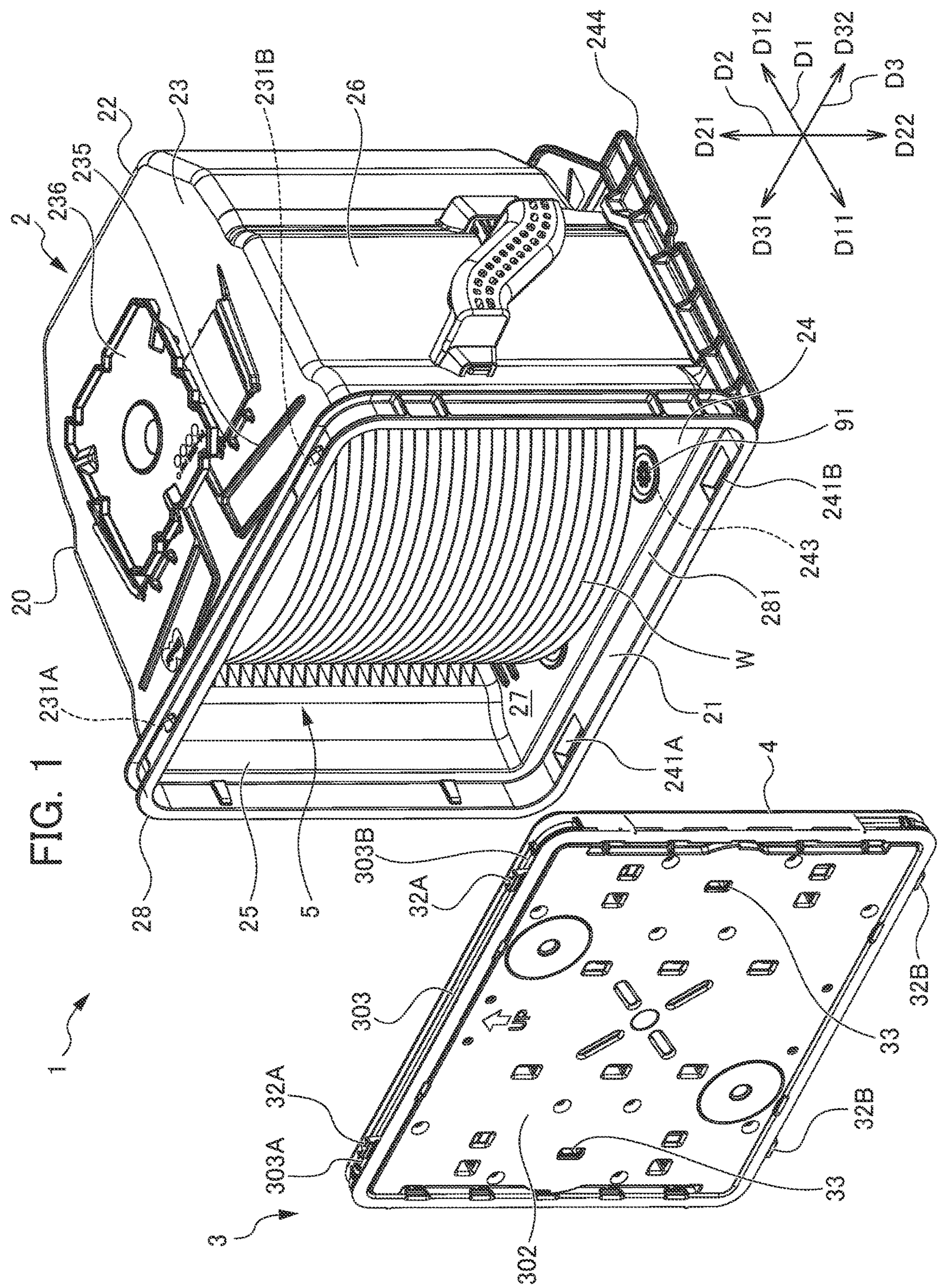
FIG. 1 is an exploded perspective view illustrating a state where a plurality of substrates W are stored in a substrate storing container 1 according to a first embodiment of the present invention.
Figure 2:
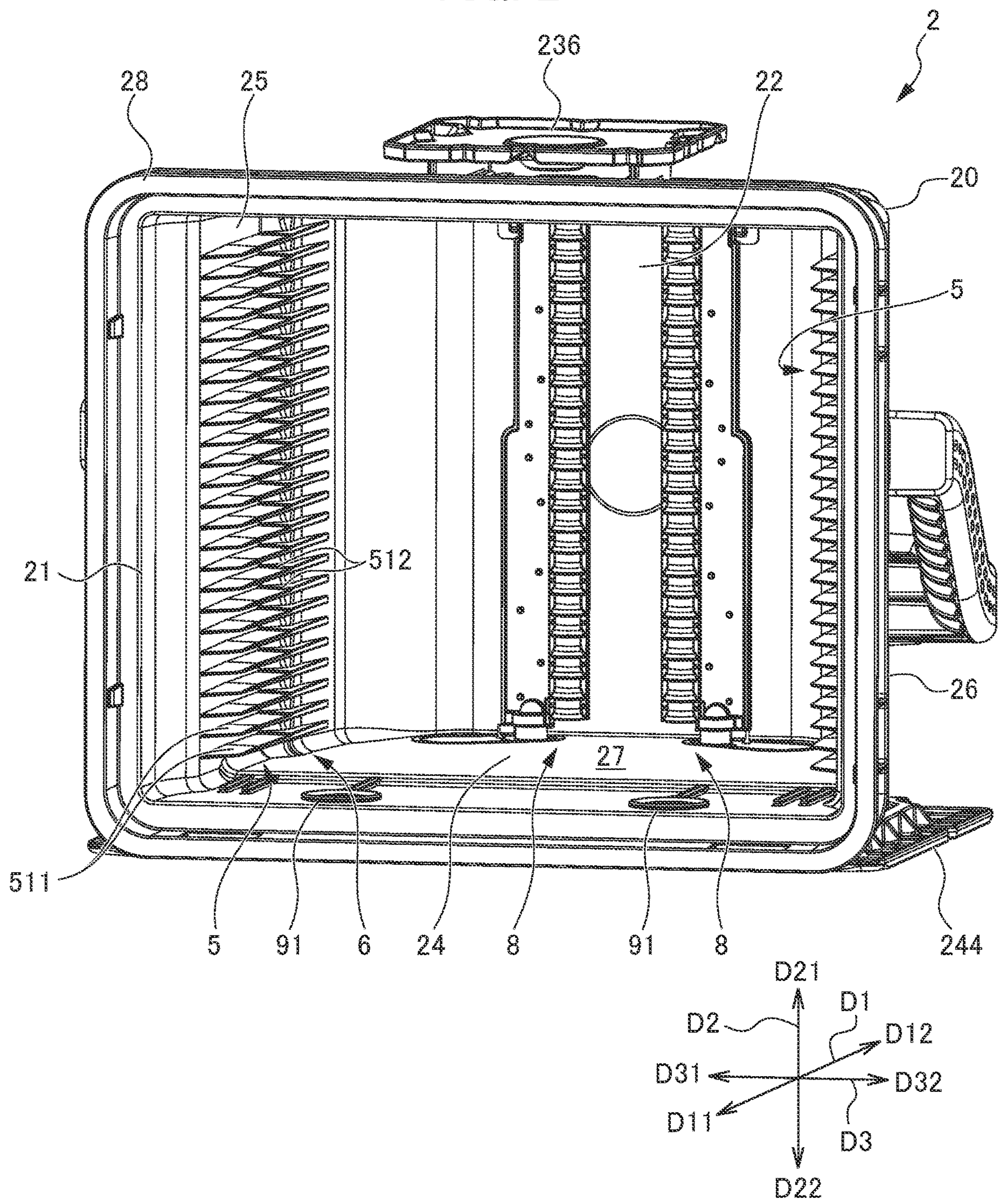
FIG. 2 is an upper perspective view illustrating a container main body 2 of the substrate storing container 1 according to the first embodiment of the present invention.
Figure 3:
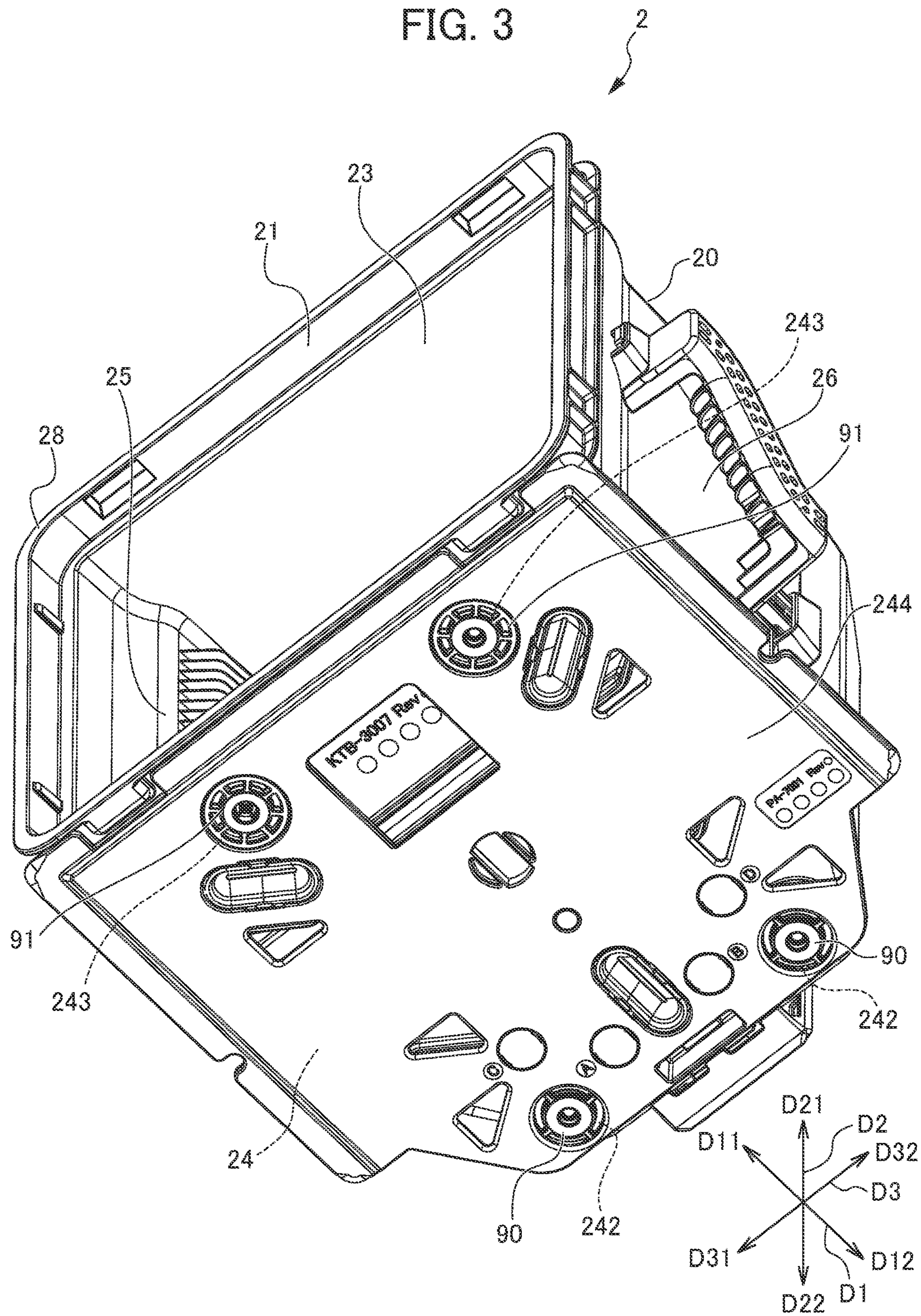
FIG. 3 is a lower perspective view illustrating the container main body 2 of the substrate storing container 1 according to the first embodiment of the present invention.
Figure 4:
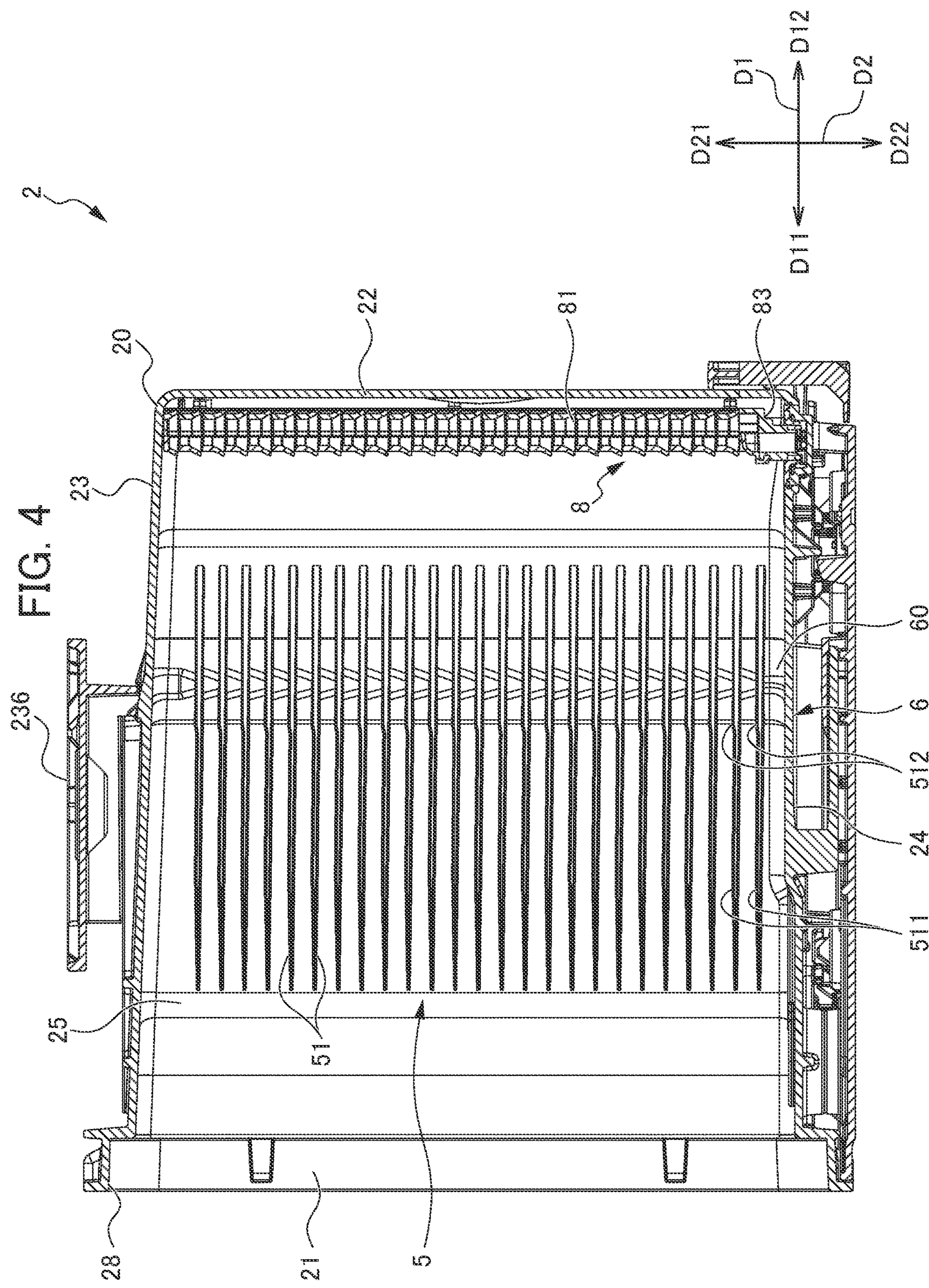
FIG. 4 is a side sectional view illustrating the container main body 2 of the substrate storing container 1 according to the first embodiment of the present invention.
Figure 5:
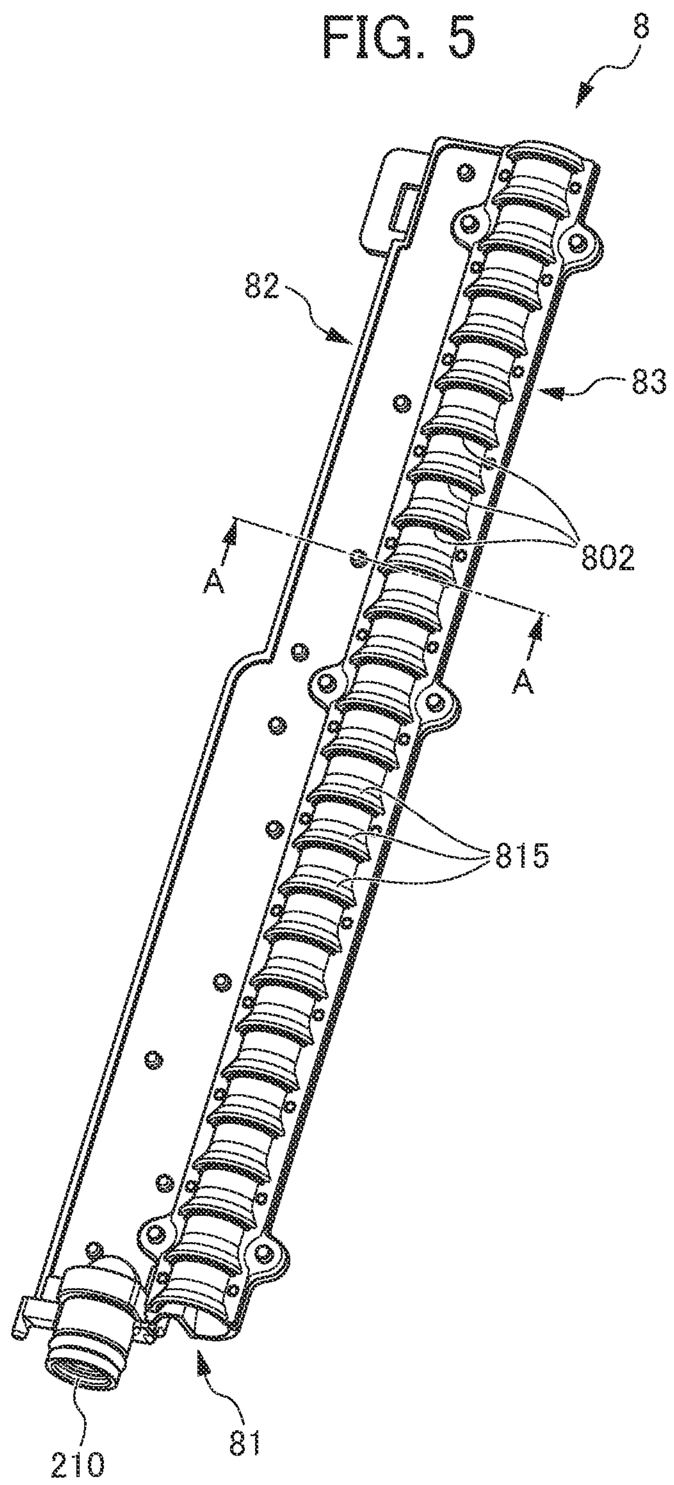
FIG. 5 is a perspective view illustrating a projection portion 8 of the substrate storing container 1 according to the first embodiment of the present invention.

Hereinafter, a substrate storing container 1 according to the first embodiment will be described with reference to the drawings. FIG. 1 is an exploded perspective view illustrating a state where a plurality of substrates W are stored in a substrate storing container 1. FIG. 2 is an upper perspective view illustrating a container main body 2 of the substrate storing container 1. FIG. 3 is a lower perspective view illustrating the container main body 2 of the substrate storing container 1. FIG. 4 is a side sectional view illustrating the container main body 2 of the substrate storing container 1. FIG. 5 is a perspective view illustrating a projection portion 8 of the substrate storing container 1.

Figure 6:
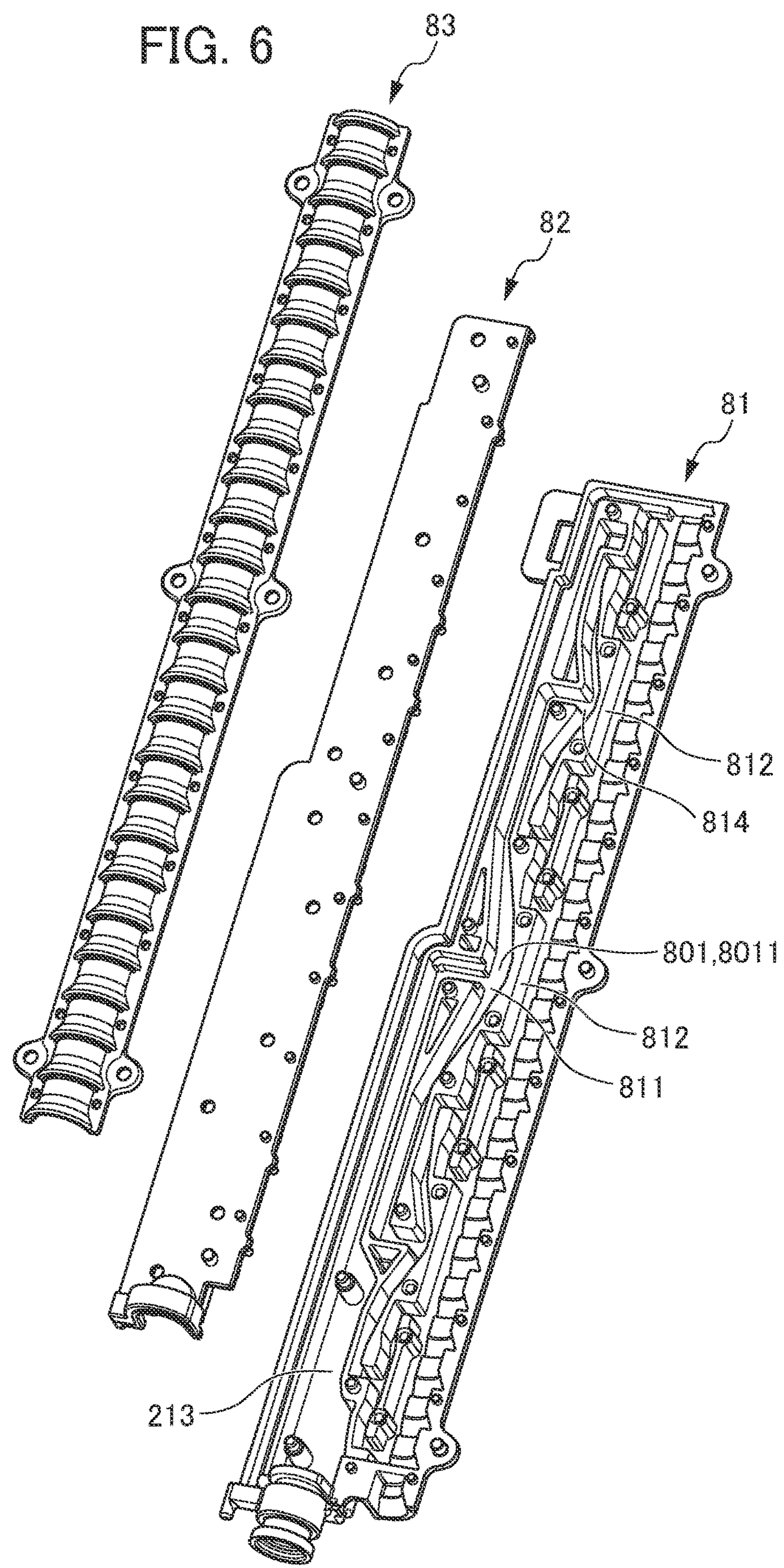
FIG. 6 is an exploded perspective view illustrating the projection portion 8 of the substrate storing container 1 according to the first embodiment of the present invention.
Figure 7:
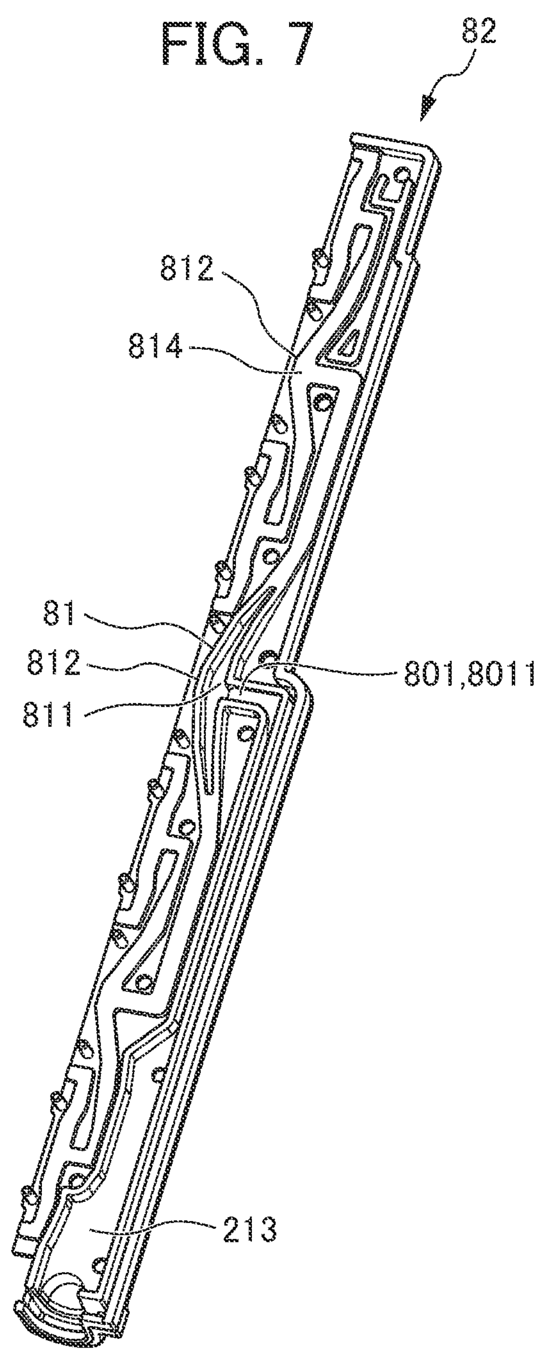
FIG. 7 is an exploded perspective view illustrating a projection flow path lid portion 82 of the projection portion 8 of the substrate storing container 1 according to the first embodiment of the present invention.
Figure 8:
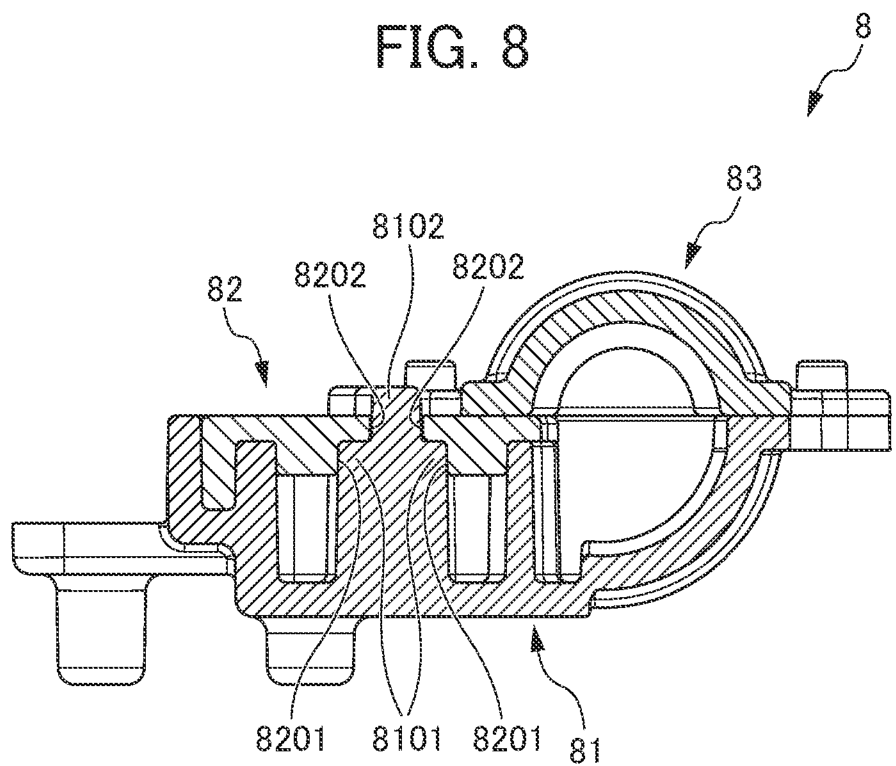
FIG. 8 is a sectional view along the A-A line of FIG. 5.

FIG. 6 is an exploded perspective view illustrating the projection portion 8 of the substrate storing container 1. FIG. 7 is an exploded perspective view illustrating a projection flow path lid portion 82 of the projection portion 8 of the substrate storing container 1. FIG. 8 is a sectional view along the A-A line of FIG. 5.

Here, for convenience of description, a direction from the container main body 2 (described later) toward a lid body 3 (direction from the upper right toward the lower left in FIG. 1) is defined as a forward direction D11, a direction opposite to the forward direction is defined as a backward direction D12, and the forward and backward directions are collectively defined as a forward/backward direction D1. In addition, a direction from a lower wall 24 (described later) toward an upper wall 23 (upper direction in FIG. 1) is defined as an upper direction D21, a direction opposite to the upper direction is defined as a lower direction D22, and the upper and lower directions are collectively defined as an upper/lower direction D2. In addition, a direction from a second side wall 26 (described later) toward a first side wall 25 (direction from the lower right toward the upper left in FIG. 1) is defined as a left direction D31, a direction opposite to the left direction is defined as a right direction D32, and the left and right directions are collectively defined as a left/right direction D3. The main drawings illustrate arrows indicating these directions.

In addition, each substrate W (see FIG. 1) stored in the substrate storing container 1 is a disk-shaped silicon wafer, a disk-shaped glass wafer, a disk-shaped sapphire wafer, or the like, and is thin for use in industries. The substrate W in the present embodiment is a silicon wafer having a diameter of 300 mm.

As illustrated in FIG. 1, the substrate storing container 1 stores the substrates W made of silicon wafers described above and is used as an in-process container for transferring the substrates in a process in a factory and used as a shipping container for transporting a substrate by means of transport such as means of transport by land, air, and sea. The substrate storing container includes the container main body 2 and the lid body 3. The container main body 2 includes substrate support plate-like portions 5 as side substrate support portions, and a back side substrate support portion 6 (see FIG. 2 etc.). The lid body 3 includes a front retainer (not illustrated) as a lid body side substrate support portion.

The container main body 2 has a tubular wall portion 20. A container main body opening portion 21 is formed in one end portion of the wall portion. The other end portion of the wall portion is blocked. A substrate storing space 27 is formed in the container main body 2. The substrate storing space 27 is formed so as to be surrounded by the wall portion 20. Each substrate support plate-like portion 5 is disposed at a part of the wall portion 20 that forms the substrate storing space 27. A plurality of substrates W can be stored in the substrate storing space 27 as illustrated in FIG. 1.

The substrate support plate-like portions 5 are provided in the wall portion 20 so as to make a pair in the substrate storing space 27. The substrate support plate-like portion 5 is capable of supporting edge portions of the plurality of substrates W, in a state where adjacent substrates W are separated from each other at a predetermined interval and arranged in parallel by abutting against the edge portions of the plurality of substrates W, when the container main body opening portion 21 is not blocked by the lid body 3. The back side substrate support portion 6 is provided by being integrally molded with the substrate support plate-like portions 5 on the back side of the substrate support plate-like portions 5.

The back side substrate support portion 6 (see FIG. 2 etc.) is provided in the wall portion 20 so as to make a pair with the front retainer (described later, not illustrated) in the substrate storing space 27. The back side substrate support portion 6 is capable of supporting rear portions of the edge portions of the plurality of substrates W by abutting against the edge portions of the plurality of substrates W when the container main body opening portion 21 is blocked by the lid body 3.

The lid body 3 is attachable to and detachable from an opening circumferential portion 28 (FIG. 1 etc.) forming the container main body opening portion 21 and is capable of blocking the container main body opening portion 21. The front retainer (not illustrated) is provided at a part of the lid body 3 that faces the substrate storing space 27 when the container main body opening portion 21 is blocked by the lid body 3. The front retainer (not illustrated) is disposed so as to make a pair with the back side substrate support portion 6 in the substrate storing space 27.

When the container main body opening portion 21 is blocked by the lid body 3, the front retainer (not illustrated) is capable of supporting front portions of the edge portions of the plurality of substrates W by abutting against the edge portions of the plurality of substrates W. When the container main body opening portion 21 is blocked by the lid body 3, the front retainer (not illustrated) retains the plurality of substrates W, in a state where the adjacent substrates W are separated from each other at the predetermined interval and arranged in parallel by supporting the plurality of substrates W in cooperation with the back side substrate support portion 6.

A resin such as a plastic material constitutes the substrate storing container 1. Unless otherwise specified, examples of the resin of the material include thermoplastic resins such as polycarbonates, cycloolefin polymers, polyetherimide, polyetherketone, polybutylene terephthalate, polyether ether ketone, and liquid crystal polymers and alloys thereof. A conductive substance such as a carbon fiber, carbon powder, a carbon nanotube, and a conductive polymer is selectively added to the resins of the molding materials in a case where conductivity is to be given. It is also possible to add a glass fiber, a carbon fiber, or the like for rigidity enhancement.

Hereinafter, each portion will be described in detail. As illustrated in FIG. 1, the wall portion 20 of the container main body 2 includes a back wall 22, the upper wall 23, the lower wall 24, the first side wall 25 and the second side wall 26. The back wall 22, the upper wall 23, the lower wall 24, the first side wall 25 and the second side wall 26 are constituted by the material described above and are configured by being integrally molded.

The first side wall 25 and the second side wall 26 face each other. The upper wall 23 and the lower wall 24 face each other. The rear edge of the upper wall 23, the rear edge of the lower wall 24, the rear edge of the first side wall 25 and the rear edge of the second side wall 26 are connected to the back wall 22 without exception. The front edge of the upper wall 23, the front edge of the lower wall 24, the front edge of the first side wall 25 and the front edge of the second side wall 26 constitute the opening circumferential portion 28 forming the substantially rectangular container main body opening portion 21.

The opening circumferential portion 28 is provided in one end portion of the container main body 2, and the back wall 22 is located in the other end portion of the container main body 2. The profile of the container main body 2 formed by the outer faces of the wall portion 20 is a box shape. The inner face of the wall portion 20, that is, the inner face of the back wall 22, the inner face of the upper wall 23, the inner face of the lower wall 24, the inner face of the first side wall 25 and the inner face of the second side wall 26 form the substrate storing space 27 surrounded by these inner faces. The container main body opening portion 21 formed in the opening circumferential portion 28 communicates with the substrate storing space 27 surrounded by the wall portion 20 and formed in the container main body 2. A maximum of 25 substrates W can be stored in the substrate storing space 27.

As illustrated in FIG. 1, latch engagement concave portions 231A, 231B, 241A and 241B concaved outward from the substrate storing space 27 are formed at parts of the upper wall 23 and the lower wall 24 near the opening circumferential portion 28. A total of four latch engagement concave portions 231A, 231B, 241A and 241B are respectively formed near both right and left end portions of the upper wall 23 and the lower wall 24.

As illustrated in FIG. 1, on the outer face of the upper wall 23, a rib 235 is provided by being molded integrally with the upper wall 23. The rib 235 enhances the rigidity of the container main body 2. A top flange 236 is fixed to the middle portion of the upper wall 23. The top flange 236 is a member becoming a part hung and suspended in the substrate storing container 1 when the substrate storing container 1 is suspended in an automatic wafer transfer system (AMHS), a wafer substrate transfer cart (PGV), or the like.

As illustrated in FIG. 3, at four corners of the lower wall 24, air supply holes 242 and exhaust holes 243, which are two types of through-holes, are formed as a ventilation path 210 (see FIG. 5 etc.). In the present embodiment, the two through-holes in the front of the lower wall 24 are the exhaust holes 243 for discharging the gas in the container main body 2 and the two through-holes in the back of the lower wall are the air supply holes 242 for supplying gas into the container main body 2. An air supply filter unit 90 is disposed in the through-hole as the air supply hole 242. An exhaust filter unit 91 is disposed in the through-hole as the exhaust hole 243. Therefore, flow paths of gas inside the air supply filter unit 90 and the exhaust filter unit 91 constitute a part of the ventilation path 210 capable of allowing communication between the substrate storing space 27 and the space outside the container main body 2. The air supply filter unit 90 and the exhaust filter unit 91 are disposed in the wall portion 20. In the air supply filter unit 90 and the exhaust filter unit 91, gas can pass between the space outside the container main body 2 and the substrate storing space 27.

The substrate support plate-like portions 5 are provided by being molded integrally with the first side wall 25 and the second side wall 26 and provided in the substrate storing space 27 so as to make a pair in the left/right direction D3. Specifically, as illustrated in FIG. 4 and the like, each of the substrate support plate-like portions 5 has plate portions 51.

Each of the plate portions 51 has a plate-like substantially arc shape. Twenty-five plate portions 51 are provided in each of the first side wall 25 and the second side wall 26 in the upper/lower direction D2, i.e., a total of 50 plate portions are provided. The adjacent plate portions 51 are separated from each other at an interval of 10 mm to 12 mm in the upper/lower direction D2 and arranged in parallel. Above the plate portion 51 located at the top, a plate-like member 59 is further disposed parallel to the plate portion 51, and this member located at the top performs a role of a guide in inserting the substrate W into the substrate storing space 27.

The 25 plate portions 51 provided in the first side wall 25 and the 25 plate portions 51 provided in the second side wall 26 face each other in the left/right direction D3. The 50 plate portions 51 and the plate-like member 59 performing the role of the plate-like guide parallel to the plate portion 51 have a parallel positional relationship to the inner face of the lower wall 24. As illustrated in FIG. 2 and the like, convex portions 511 and 512 are provided on the upper face of each plate portion 51. The substrate W supported on the plate portion 51 is only in contact with projection ends of the convex portions 511 and 512 and is not in contact with the plate portion 51 with an area.

The substrate support plate-like portions 5 having such a configuration are capable of supporting the edge portions of the plurality of substrates W, in a state where the adjacent substrates W of the plurality of substrates W are separated from each other at a predetermined interval and arranged in parallel.

As illustrated in FIG. 4, the back side substrate support portion 6 has back side end edge support portions 60. The back side end edge support portions 60 are configured by being integrally molded with the container main body 2 in the rear end portions of the plate portions 51 of the substrate support plate-like portions 5.

The number of the back side end edge support portions 60 corresponds to the number of the substrates W that can be stored in the substrate storing space 27, specifically, 25 back side end edge support portions are provided. The back side end edge support portions 60 disposed in the first side wall 25 and the second side wall 26 have a positional relationship that makes a pair with the front retainer described later in the forward/backward direction D1. The substrates W are stored in the substrate storing space 27 and then the lid body 3 is closed, thereby allowing the back side end edge support portions 60 to clamp and support the end edges of the edge portions of the substrates W.

As illustrated in FIG. 2 and the like, the back wall 22 has projection portions 8 as gas ejection nozzle portions. Each projection portion 8 includes a projection main body portion 81 illustrated in FIGS. 5 and 6, and a projection flow path lid portion 82 and a projection nozzle lid portion 83 that cover the entire surface of the projection main body portion illustrated in FIG. 6 and fixed to the projection main body portion, and constitutes a component attached to the container main body 2. As illustrated in FIG. 2, two projection portions 8 make a pair, project like ribs toward the container main body opening portion 21 and extend from the upper end to the lower end of the back wall 22 in parallel. That is, the projection portion 8 has a hollow columnar shape. The projection portion 8 includes a plurality of opening portions 802 that supply, to the substrate storing space 27, the gas flowing into the ventilation path 210 capable of allowing communication between the substrate storing space 27 and the space outside the container main body 2, and a gas flow rate uniformizing unit allowing the gas to flow out through the plurality of opening portions 802 at a uniformized flow rate.

Specifically, the gas flow rate uniformizing unit includes a branch path 801 that is a branch path formed between the opening portion 802 and the ventilation path 210 capable of allowing communication between the substrate storing space 27 and the space outside the container main body 2, to branch flow of gas from the ventilation path 210.

Between the upper end of a vertical extending portion 213 extending in the upper direction D21 of the ventilation path 210 and the opening portion 802, a branch path 8011 is formed to branch flow of purge gas from the ventilation path 210 and to constitute the gas flow rate uniformizing unit. Specifically, as illustrated in FIG. 6, the projection main body portion 81 has one inlet 811. A branch wall portion 812 is provided in the forward direction D11 of the projection main body portion 81.

An outlet 814 (see FIG. 6) is formed on the downstream side of the purge gas of each flow branched by the branch wall portion 812.

Similarly, up to the opening portion 802, the outlet 814 and the branch wall portion 812 facing the outlet 814 form a purge gas flow path, and this purge gas flow path has a shape like a tournament chart of a tournament match as if to win. In the present embodiment, the purge gas is branched three times between the inlet 811 and the opening portion 802 and flows out from the opening portion 802 toward the container main body opening portion 21. The part of the projection main body portion 81 facing the outlet 814 located on the most downstream side includes no branch wall portion 812.

The projection portion 8 also has a cleaning solution inflow obstructing portion. As illustrated in FIG. 5, the cleaning solution inflow obstructing portion is made up of inclined eaves 815 that incline in the lower direction D22 as proceeding in the forward direction D11, near the opening portion 802, more specifically, on the upper and lower sides of the opening portion 802. The inclined eaves 815 extend parallel to each other. The inclined eaves 815 obstruct inflow of a cleaning solution from the opening portion 802 to a ventilation path 210 side near the opening portion 802, when cleaning the container main body 2.

A connected part of the projection main body portion 81 to the projection flow path lid portion 82 and the projection nozzle lid portion 83 includes press-fit fixing portions that are configured by being positioned by means of press fitting while being fixed to each other, and an impulse welding portion that is formed by impulse welding, to maintain the positioning and fixing in the press-fit fixing portions.

Specifically, the projection flow path lid portion 82 is press fitted into an opening in an upper end portion of the projection main body portion 81 so as to block an opening of an upper end portion of a part in which the branch path 801 is formed and which constitutes the gas flow rate uniformizing unit in the projection main body portion 81 illustrated in FIG. 8, the projection flow path lid portion 82 is positioned relative to the projection main body portion 81, and the projection main body portion 81 and the projection flow path lid portion 82 are fixed to each other.

That is, in a tip side portion (lower end portion 8201) of a part having a shape of an opening in the projection flow path lid portion 82, a part of a base portion 8101 of a convex member including a pin-like member 8102 is fitted by press fitting, the pin-like member projecting in an upward direction of FIG. 8 like a pin provided in the projection main body portion 81. Thus, parts that are fitted and positioned by means of press fitting while being fixed to each other constitute press-fit fixing portions. Further, the pin-like member 8102 is inserted into a base portion (upper portion 8202) of the part having the shape of the opening in the projection flow path lid portion 82, and the upper portion 8202 and the pin-like member 8102 are impulse welded to constitute an impulse welding portion.

Further, the projection nozzle lid portion 83 is provided so as to block an opening in an upper end of a part of the projection main body portion 81 illustrated in FIG. 8, the part being formed with the opening portions 802 and provided with the inclined eaves 815. The projection main body portion 81 and the projection nozzle lid portion 83 are fixed by press-fit fixing portions and an impulse welding portion in the same manner as in fixing the projection main body portion 81 and the projection flow path lid portion 82.

As illustrated in FIG. 1, the lid body 3 has a substantially rectangular shape that substantially matches the shape of the opening circumferential portion 28 of the container main body 2. The lid body 3 is attachable to and detachable from the opening circumferential portion 28 of the container main body 2. The container main body opening portion 21 can be blocked by the lid body 3 by mounting the lid body 3 in the opening circumferential portion 28, with a positional relationship in which the lid body 3 is surrounded by the opening circumferential portion 28.

An annular sealing member 4 is attached to the inner face of the lid body 3 (rear face of the lid body 3 illustrated in FIG. 1) so as to go around the outer circumferential edge portion of the lid body 3. The face faces a face (sealing face 281) of a step part formed at a position directly behind the opening circumferential portion 28 in the backward direction D12 at a time when the lid body 3 blocks the container main body opening portion 21. The sealing member 4 is disposed so as to go around the lid body 3. The sealing member 4 is made of various types of elastically deformable thermoplastic elastomers such as polyester-based elastomers and polyolefin-based elastomers, fluororubber, silicon rubber, or the like.

When the lid body 3 is mounted in the opening circumferential portion 28, the sealing member 4 is elastically deformed by being sandwiched between the sealing face 281 (see FIG. 1) of the container main body 2 and the inner face of the lid body 3. In other words, with the sealing member 4 interposed between lid body 3 and the container main body 2, the lid body 3 can block the container main body opening portion 21 in a state where the lid body 3 and the opening circumferential portion 28 do not abut against each other and are separated from each other. By the lid body 3 being removed from the opening circumferential portion 28, the substrate W can be taken in and out of the substrate storing space 27 in the container main body 2.

The lid body 3 is provided with a latch mechanism. The latch mechanism is provided near both right and left end portions of the lid body 3. As illustrated in FIG. 1, the latch mechanism includes two upper side latch portions 32A and 32A capable of projecting upward from the upper side of the lid body 3, and two lower side latch portions 32B and 32B capable of projecting downward from the lower side of the lid body 3. The two upper side latch portions 32A and 32A are disposed near both right and left ends of the upper side of the lid body 3. The two lower side latch portions 32B and 32B are disposed near both right and left ends of the lower side of the lid body 3.

An operation portion 33 is provided on the outer face of the lid body 3. By operating the operation portion 33 from the front side of the lid body 3, it is possible to cause the upper side latch portions 32A and 32A and the lower side latch portions 32B and 32B to project from the upper and lower sides of the lid body 3 and to cause the upper and lower side latch portions not to project from the upper and lower sides. The upper side latch portions 32A and 32A are engaged with the latch engagement concave portions 231A and 231B of the container main body 2 by projecting upward from the upper side of the lid body 3 and the lower side latch portions 32B and 32B are engaged with the latch engagement concave portions 241A and 241B of the container main body 2 by projecting downward from the lower side of the lid body 3. As a result, the lid body 3 is fixed to the opening circumferential portion 31 of the container main body 2.

A concave portion (not illustrated) concaved outward (forward direction D11) from the storing space 27 is formed on the inner side (side of the backward direction D12 of the lid body 3 in FIG. 1) of the lid body 3. The front retainer (not illustrated) is fixedly provided at parts of the lid body 3 in the concave portion (not illustrated) and outside the concave portion.

The front retainer (not illustrated) has front retainer substrate receiving portions (not illustrated). The front retainer substrate receiving portions (not illustrated) are disposed two by two so as to make a pair and at a predetermined interval in the left/right direction. The front retainer substrate receiving portions disposed two by two so as to make a pair as described above are provided in a state where 25 pairs are arranged in parallel in the upper/lower direction. The front retainer substrate receiving portions clamp and support the end edge of the edge portion of the substrate W by the substrate W being stored in the storing space 27 and the lid body 3 being closed.

According to the substrate storing container 1 of the present embodiment having the above configuration, the following effects can be obtained. As described above, the connected part between the projection main body portion 81 and the projection flow path lid portion 82 or the projection nozzle lid portion 83 that is the other component includes the press-fit fixing portions that are configured by being positioned by means of press fitting while being fixed to each other, and the impulse welding portion that is formed by impulse welding, to maintain the positioning and fixing in the press-fit fixing portions.

According to the above configuration, since melt fixing for prevention of disengagement is performed by the impulse welding after performing the press fitting to determine positioning accuracy, the substrate storing container 1 having high positional accuracy can be stably produced. Furthermore, physical heating is performed by the impulse welding, followed by caulking and cooling, and hence it is possible to prevent dust generation. In addition, there is no need to apply a load to the components to each other or to the container main body, and it is therefore possible to prevent the components from being deformed. For this reason, it is possible to make the substrate storing container 1 that is clean and has high dimensional accuracy.

Further, the base portion 8101 of the convex member having the pin-like member 8102 is press fitted into the lower end portion 8201 as a tip side portion of the inserted portion, positioned and fixed, and the base portion 8101 and the lower end portion 8201 constitute the press-fit fixing portion. The pin-like member 8102 that is the tip side portion is impulse welded to the upper portion 8202 that is the base portion of the inserted portion, and the pin-like member 8102 and the upper portion 8202 constitute the impulse welding portion.

According to the above configuration, the pin-like member 8102 and the base portion 8101 of the member can constitute the impulse welding portion and the press-fit fixing portion, and the lower end portion 8201 and the upper portion 8202 that is the base portion of the lower end portion can constitute the press-fit fixing portion and the impulse welding portion, so that the press-fit fixing portion and the impulse welding portion can be configured to be compact in a smaller space.

Further, the projection portion 8 as the gas ejection nozzle portion is made up of the projection main body portion 81 including a plurality of components connected to each other, and the projection flow path lid portion 82 and the projection nozzle lid portion 83 that are the other components, and the connected part between the projection main body portion 81 and the projection flow path lid portion 82 or the projection nozzle lid portion 83 includes the press-fit fixing portion and the impulse welding portion. Thereby, the projection portion 8 can be made a clean gas ejection nozzle portion having high dimensional accuracy.

Figure 9:
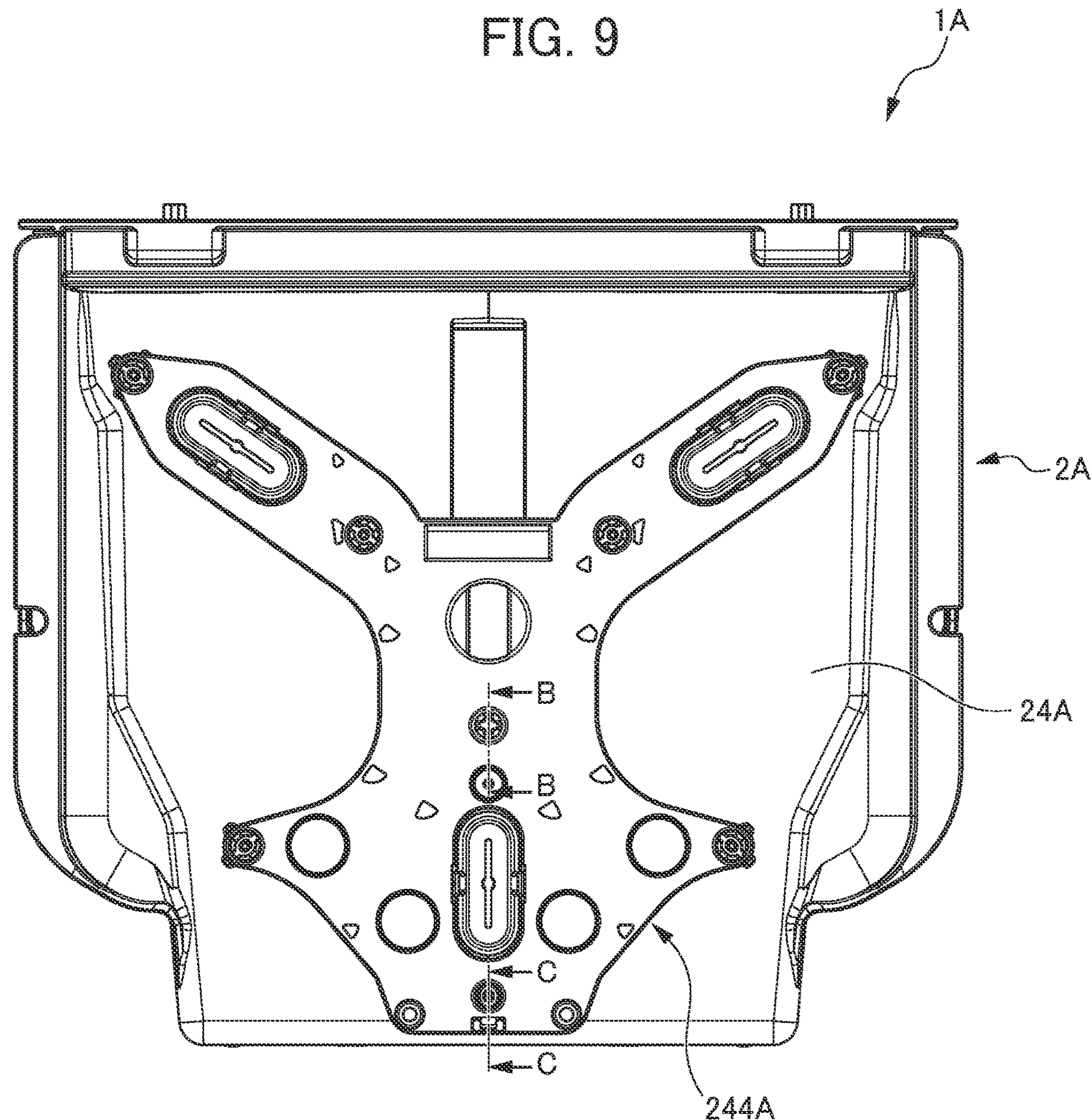
FIG. 9 is a bottom view illustrating a container main body 2A of a substrate storing container 1A according to a second embodiment of the present invention.
Figure 10:
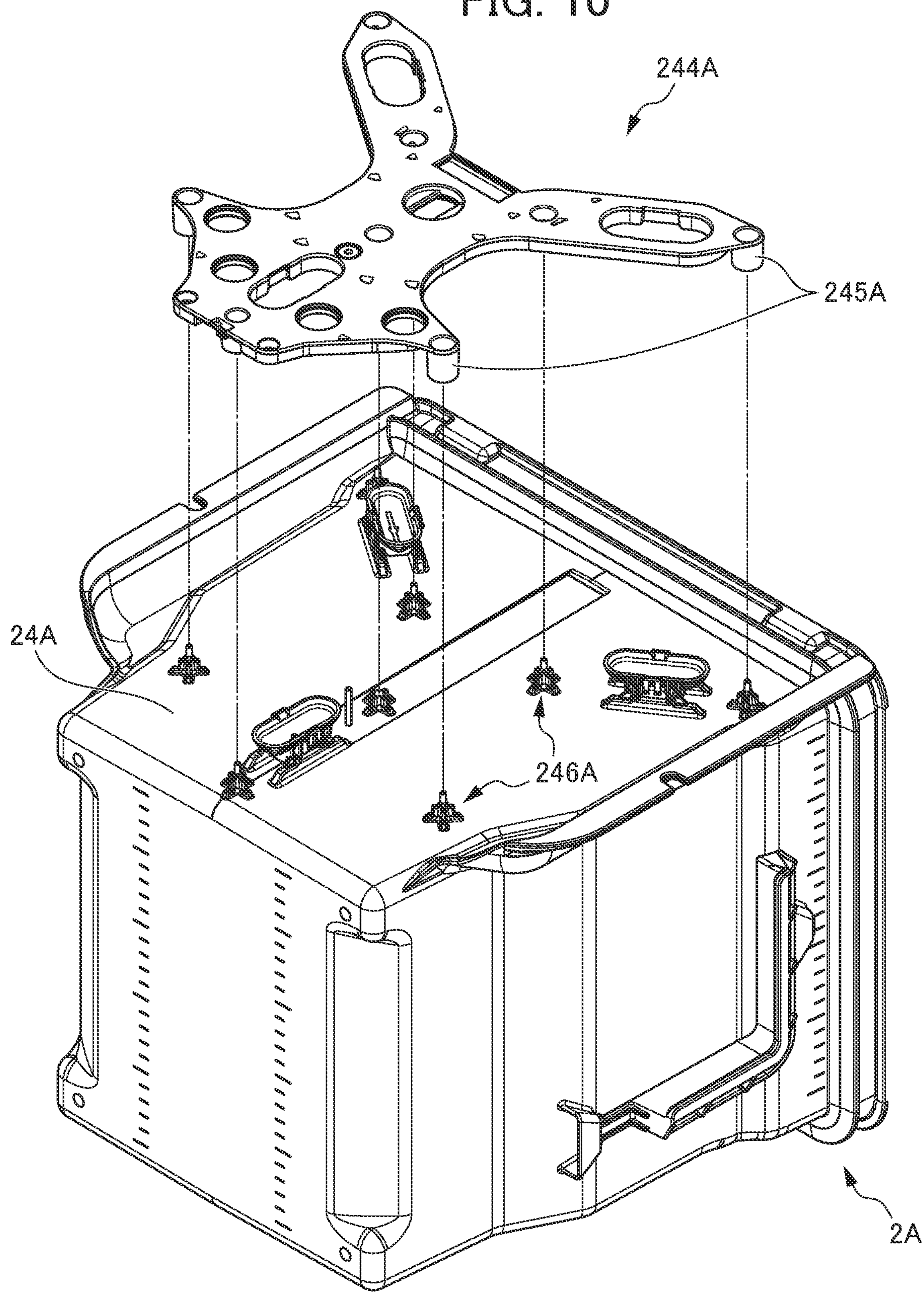
FIG. 10 is an exploded perspective view illustrating the container main body 2A of the substrate storing container 1A according to the second embodiment of the present invention.
Figure 11:
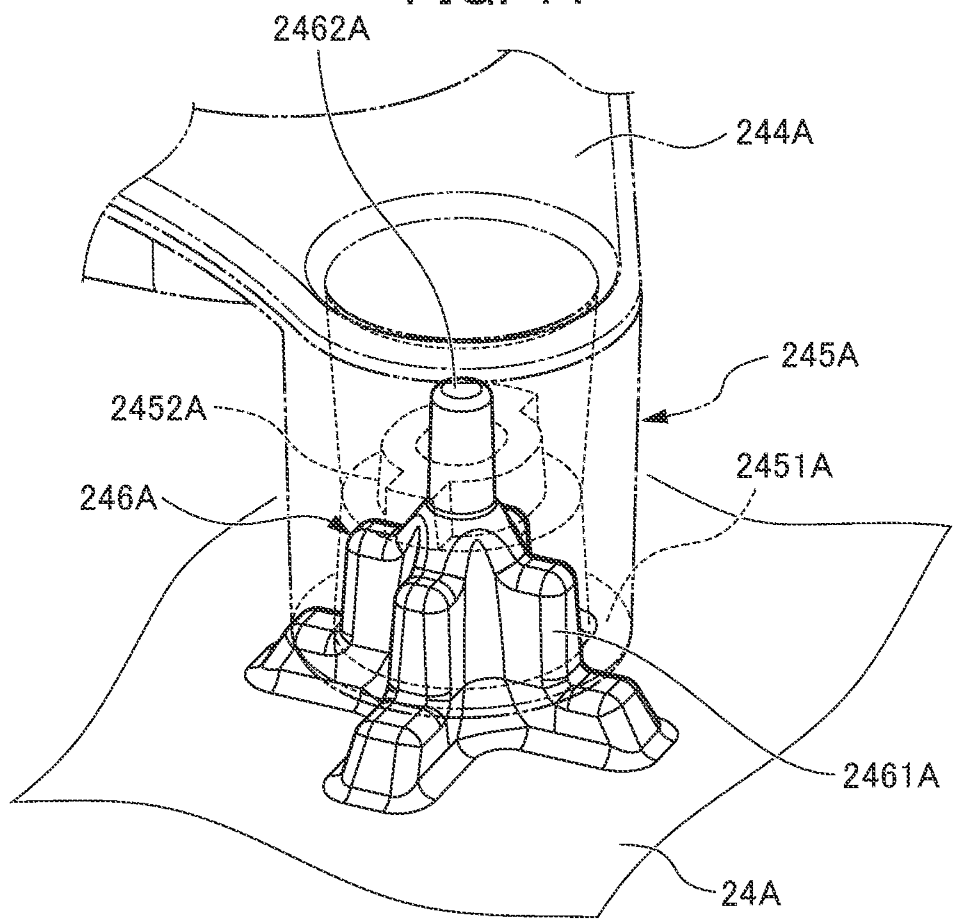
FIG. 11 is an enlarged perspective view illustrating a connected part between a lower wall 24A of the container main body 2A of the substrate storing container 1A and a bottom plate 244A according to the second embodiment of the present invention.
Figure 12:
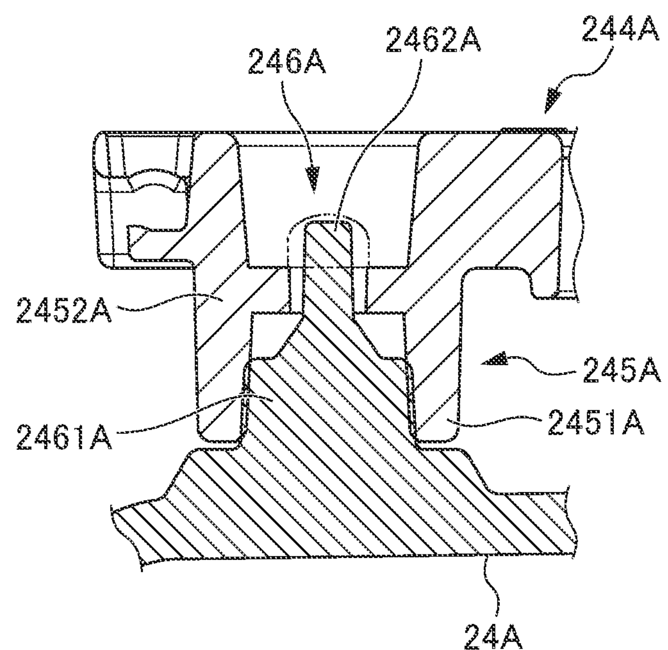
FIG. 12 is an enlarged sectional view illustrating the connected part between the lower wall 24A of the container main body 2A of the substrate storing container 1A and the bottom plate 244A according to the second embodiment of the present invention.

Next, a second embodiment of the present invention will be described with reference to the drawings. FIG. 9 is a bottom view illustrating a container main body 2A of a substrate storing container 1A. FIG. 10 is an exploded perspective view illustrating the container main body 2A of the substrate storing container 1A. FIG. 11 is an enlarged perspective view illustrating a connected part between a lower wall 24A of the container main body 2A of the substrate storing container 1A and a bottom plate 244A. FIG. 12 is an enlarged sectional view illustrating the connected part between the lower wall 24A of the container main body 2A of the substrate storing container 1A and the bottom plate 244A, and a sectional view along the C-C line of FIG. 9.

The second embodiment is different in a component connected to the container main body 2A by the connected part configured by press-fit fixing portions and an impulse welding portion. The other configuration is similar to that in the first embodiment. Accordingly, the same members are denoted with the same reference numerals and are not described.

As illustrated in FIG. 9, the bottom plate 244A is fixed to the lower wall 24A. The bottom plate 244A is configured by a plate-shaped member, and the member has a shape in which a portion extends from a middle of a lower face, constituting an outer face of the lower wall 24A, toward left and right front ends of the lower wall 24A and also toward a middle of a rear end of the lower wall 24A in a left/right direction. The portion, in the middle of extending toward the middle of the rear end of the lower wall 24A in the left/right direction, extends toward respective left and right directions. The connected part between the lower wall 24A and the bottom plate 244A includes press-fit fixing portions positioned by press fitting while being fixed to each other, and an impulse welding portion formed by impulse welding, to maintain the positioning and fixing in the press-fit fixing portions.

Specifically, each end of a part that includes a circumferential portion of the bottom plate 244A and that extends as described above includes a cylindrical upward projection portion 245A that projects in an upper direction D21 (lower direction in FIGS. 10 to 12). Into a tip side portion (upper end portion 2451A) of the upward projection portion 245A, a part of a base portion 2461A of a convex member including a pin-like member 2462A is fitted by press fitting. The pin-like member projects upward in FIG. 12 like a pin of a fixing downward projection portion 246A provided by being integrally molded to project downward from the lower wall 24A. Thus, the parts that are positioned and fitted by means of press fitting while being fixed to each other constitute press-fit fixing portions.

Further, as illustrated in FIG. 12, a through hole is formed in a base portion (lower portion 2452A) of the upward projection portion 245A. The pin-like member 2462A is inserted into the through hole, and the lower portion 2452A and the pin-like member 2462A are impulse welded to constitute an impulse welding portion. The impulse welded pin-like member 2462A has a shape indicated with a double-dashed chain line in FIG. 12.

According to the substrate storing container of the present embodiment having the above configuration, the following effects can be obtained. As described above, the component, fixed to the container main body 2A in which the connected part is made up of the press-fit fixing portions and the impulse welding portion, is the bottom plate 244A fixed to the lower wall 24A to constitute a bottom portion of the container main body 2A together with the lower wall. This configuration can make the container main body 2A, to which the bottom plate 244A is fixed, a clean container main body having high dimensional accuracy.

Figure 13:
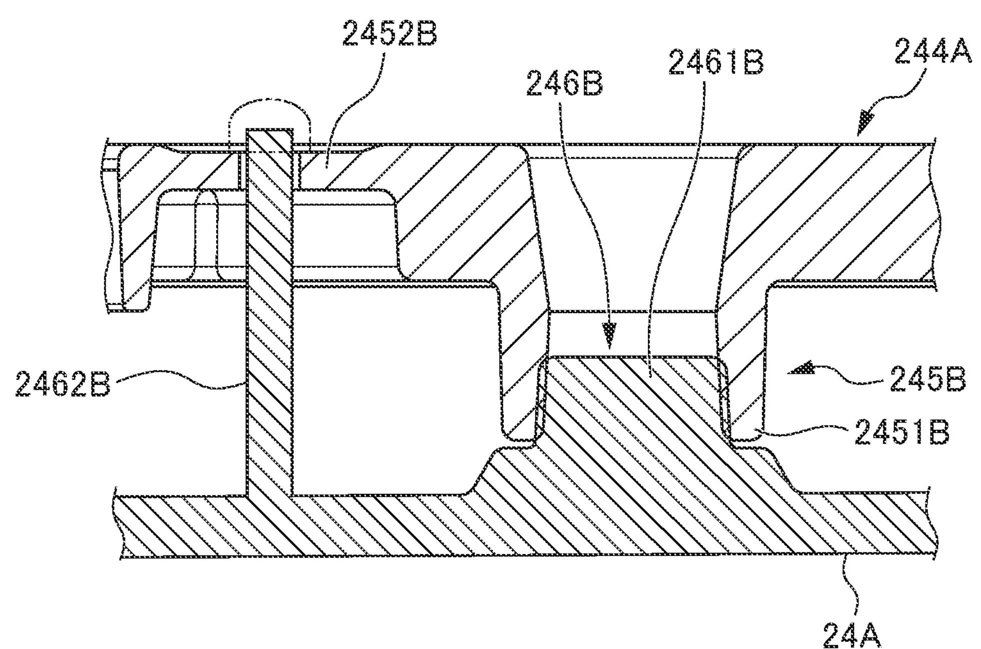
FIG. 13 is an enlarged sectional view illustrating a connected part between a lower wall 24A of a container main body of a substrate storing container and a bottom plate 244A according to a third embodiment of the present invention.

Next, a third embodiment of the present invention will be described with reference to the drawings. FIG. 13 is an enlarged sectional view illustrating a connected part between a lower wall 24A of a container main body of a substrate storing container and a bottom plate 244A, and a sectional view along the line B-B of FIG. 9.

The third embodiment is different in a component connected to the container main body by the connected part configured by press-fit fixing portions and an impulse welding portion. The other configuration is similar to that in the second embodiment. Accordingly, the same members are denoted with the same reference numerals and are not described.

As illustrated in FIG. 13, the bottom plate 244A is fixed to the lower wall 24A. The connected part between the lower wall 24A and the bottom plate 244A includes press-fit fixing portions positioned by press fitting while being fixed to each other, and an impulse welding portion formed by impulse welding, to maintain the positioning and fixing in the press-fit fixing portions.

Specifically, the bottom plate 244A includes an upward projection portion 245B having a cylindrical shape projecting in an upper direction D21 (lower direction in FIG. 13). Into a tip side portion (upper end portion 2451B) of the upward projection portion 245B, an upward projecting columnar member 2461B of a fixing downward projection portion 246B in FIG. 13 is fitted by press fitting. The downward projection portion is provided by being integrally molded to project downward from the lower wall 24A. Thus, the parts that are positioned and fitted by means of press fitting while being fixed to each other constitute press-fit fixing portions.

Further, a through hole is formed in another part 2452B different from a part of the bottom plate 244A including the upward projection portion 245B. A pin-like member 2462B provided in another part different from a part of the lower wall 24A that is provided with a fixing downward projection portion 246B is inserted into the through hole. The other part 2452B and the pin-like member 2462B are impulse welded to constitute an impulse welding portion. The impulse welded pin-like member 2462B has a shape indicated with a double-dashed chain line in FIG. 13.

According to the substrate storing container of the present embodiment having the above configuration, the following effects can be obtained. As described above, the tip side portion of the columnar member 2461B does not constitute the impulse welding portion, and the pin-like member 2462B that is the other part different from the columnar member 2461B constitutes the impulse welding portion. With this configuration, since the press-fit fixing portion and the impulse welding portion are configured in different parts, it is possible to make a substrate storing container with a heightened degree of freedom in design.

The present invention is not limited to the embodiments described above and can be modified within the technical scope described in the claims.

For example, the shapes of the container main body and the lid body, and the number and dimensions of the substrates that can be stored in the container main body are not limited to the shapes of the container main body 2 and the lid body 3 and the number and dimensions of the substrates W that can be stored in the container main body 2 in the present embodiment. The substrate W in the present embodiment is a silicon wafer having a diameter of 300 mm, but the present invention is not limited to this value.

For example, it has been described in the present embodiment that the connected part between the container main body and the bottom plate 244A that is the component attached to the container main body includes the press-fit fixing portion and the impulse welding portion. Also, it has been described that the connected part between the projection main body portion 81 that is the component attached to the container main body and the projection flow path lid portion 82 or the projection nozzle lid portion 83 that is the other component includes the press-fit fixing portion and the impulse welding portion, but the present invention is not limited to this configuration. The component may be a component attached to the lid body, and in this case, a connected part between the component and the lid body may include a press-fit fixing portion and an impulse welding portion.

In the present embodiment, the back side substrate support portion has the back side end edge support portion 60 configured by being integrally molded with the container main body 2, in the rear end portion of the plate portion 51 of the substrate support plate-like portion 5, but the present invention is not limited to this configuration. For example, the back side substrate support portion may not be configured by being integrally molded with the container main body but may be separated from the container main body.

In the present embodiment, the two through-holes in the front of the lower wall 24 are the exhaust holes 243 for discharging the gas in the container main body 2 and the two through-holes in the back of the lower wall are the air supply holes 242 for supplying gas into the container main body 2, but the present invention is not limited to this configuration. For example, at least one of the two through-holes in the front of the lower wall may be an air supply hole for supplying gas into the container main body.

EXPLANATION OF REFERENCE NUMERALS

1 substrate storing container
2 container main body
3 lid body
8 projection portion (component, gas ejection nozzle portion)
20 wall portion
21 container main body opening portion
22 back wall
23 upper wall
24 lower wall
25 first side wall
26 second side wall
27 substrate storing space
28 opening circumferential portion
210 ventilation path
244A bottom plate (component)
802 opening portion
2451A upper end portion (press-fit fixing portion, inserted portion)
2451B upper end portion (press-fit fixing portion, inserted portion)
2452A lower portion (impulse welding portion, inserted portion)
2452B another part (impulse welding portion, inserted portion)
2461A base portion (press-fit fixing portion, convex member)
2461B columnar member (press-fit fixing portion, convex member)
2462A pin-like member (impulse welding portion, convex member)
2462B pin-like member (impulse welding portion, convex member)
8101 base portion (press-fit fixing portion, convex member)
8102 pin-like member (impulse welding portion, convex member)
8201 lower end portion (press-fit fixing portion, inserted portion)
8202 upper portion (impulse welding portion, inserted portion)
W substrate

The invention claimed is:

1. A substrate storing container comprising:

a container main body that includes: a tubular wall portion including an opening circumferential portion provided with a container main body opening portion formed in one end portion, with another end portion being blocked; and a substrate storing space that is made by an inner face of the wall portion, can store a plurality of substrates and communicates with the container main body opening portion;

a lid body that is attachable to and detachable from the container main body opening portion, and can block the container main body opening portion; and a component that is attached to the container main body or the lid body, wherein a connected part between one of the component, and the container main body, the lid body or another component includes:

press-fit fixing portions that are configured by being positioned by means of press fitting of one of the component to the container main body, the lid body or the another component while being fixed to each other;

an impulse welding portion that is formed by impulse welding of one of the component to the container main body, the lid body or the another component, to maintain the positioning and fixing in the press-fit fixing portions, and the press-fit fixing portions are located at a region outside the impulse welding portion.

2. The substrate storing container according to claim 1, wherein each of the press-fit fixing portions is made up of a convex member, and an inserted portion into which the convex member is inserted, the convex member has a base portion that is press fitted, positioned and fixed into a tip side portion of the inserted portion, the base portion of the convex member and the tip side portion of the inserted portion constitute the press-fit fixing portion, and the tip side portion of the convex member is impulse welded to the base portion of the inserted portion, and the tip side portion of the convex member and the base portion of the inserted portion constitute the impulse welding portion.

3. The substrate storing container according to claim 1, wherein each of the press-fit fixing portions is made up of a convex member, and an inserted portion into which the convex member is inserted, the convex member is press fitted, positioned and fixed into the inserted portion, the convex member and the inserted portion constitute the press-fit fixing portion, a tip side portion of the convex member does not constitute the impulse welding portion, and another part different from the convex member constitutes the impulse welding portion.

4. The substrate storing container according to claim 1, wherein the container main body includes the wall portion including a back wall, an upper wall, a lower wall, and a pair of side walls, the other end portion of the wall portion is blocked by the back wall, and the container main body opening portion is formed by one end portion of the upper wall, one end portion of the lower wall, and one end portion of each of the side walls, and the component is a bottom plate that is fixed to the lower wall to constitute a bottom portion of the container main body together with the lower wall.

5. The substrate storing container according to claim 1, further comprising:

a ventilation path allowing communication between the substrate storing space and a space outside the container main body, and a gas ejection nozzle portion including a plurality of opening portions that supply, to the substrate storing space, gas flowing into the ventilation path, wherein the gas ejection nozzle portion is made up of a plurality of components connected to each other, and a connected part between the plurality of components includes the press-fit fixing portions and the impulse welding portion.

* * * * *